United States Patent
Burdick, Jr. et al.

(10) Patent No.: US 6,819,001 B2
(45) Date of Patent: Nov. 16, 2004

(54) INTERPOSER, INTERPOSER PACKAGE AND DEVICE ASSEMBLY EMPLOYING THE SAME

(75) Inventors: William E. Burdick, Jr., Niskayuna, NY (US); James W. Rose, Guilderland, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/388,997

(22) Filed: Mar. 14, 2003

(65) Prior Publication Data

US 2004/0178484 A1 Sep. 16, 2004

(51) Int. Cl.[7] .............................................. H01L 23/48
(52) U.S. Cl. ...................... 257/778; 257/777; 257/773; 257/786
(58) Field of Search ................................ 257/778, 777, 257/773, 786, 698, 712, 723, 684

(56) References Cited

U.S. PATENT DOCUMENTS 3,982,268 A * 9/1976 Anthony et al. .............. 257/45
5,258,648 A * 11/1993 Lin ............................. 257/778
6,496,370 B2 * 12/2002 Geusic et al. ................ 361/699

OTHER PUBLICATIONS

Burdick, W. E., "Electronic Array and Methods for Fabricating Same", pending U.S. patent application Ser. No. 10/313,078, filing date Dec. 6, 2002.

* cited by examiner

*Primary Examiner*—Mark V. Prenty
(74) *Attorney, Agent, or Firm*—Kevin P. Radigan, Esq.; Heslin Rothenberg Farley & Mesiti P.C.

(57) ABSTRACT

An interposer, interposer package and device assembly employing the same are provided. The interposer has a substrate formed of a semiconductor material, with first input/output contacts disposed over a first main surface thereof and second input/output contacts disposed over a second main surface thereof. The second input/output contacts are electrically connected to the first input/output contacts. The first input/output contacts disposed over the first main surface of the interposer substrate are for attachment to input/output pads of a device to which the interposer is to be attached. The second input/output contacts disposed over the second main surface of the interposer substrate facilitate electrical coupling to a component to which the interposer is also to be attached.

27 Claims, 4 Drawing Sheets

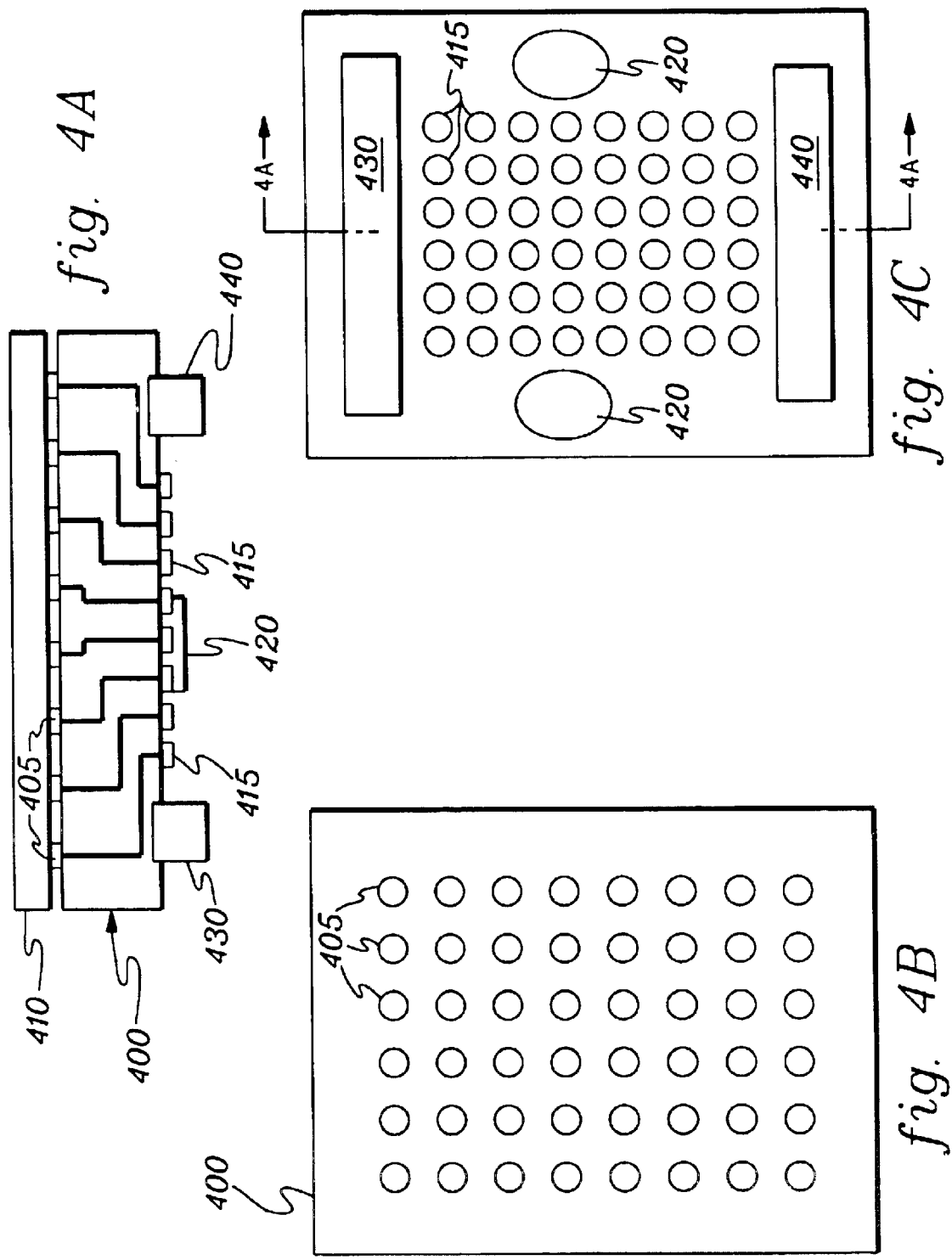

INTERPOSER, INTERPOSER PACKAGE AND DEVICE ASSEMBLY EMPLOYING THE SAME

BACKGROUND OF THE INVENTION

The present invention relates generally to the field of electronic interconnect systems, and more particularly, to an interposer and interposer package for facilitating electrical connection to, for example, an unpackaged integrated circuit device.

Today, integrated circuit devices can be fabricated with features as small as 0.1 microns, with input/output pads as small as 0.2 micron pitch, or less. Input/output pads for these devices are typically configured according to minimum interconnect features, i.e., input/output pad pitch is conventionally determined by an interconnect pitch and/or configuration capability, rather than a device or wafer pitch capability. The current minimum feature for flexible circuit interconnect is 10 microns and for flexible printed circuit board (PCB) is 50 microns. Accordingly, the existing interconnect systems used to connect device input/output to "system" input/output lag the theoretical maximum density of integrated circuits by 100x (for flexible interconnect) and by 500x (for PCB). Although alternative high density, fine pitch interconnect systems are contemplated, for example, carbon nanotubes, there currently exists an impediment or density barrier to interconnecting high density input/output devices to "systems". This impediment results from functional performance, capability, and cost limitations of existing interconnect systems.

In order to maintain small package footprints and volumes for high density input/output (I/O) devices, area array configurations are often utilized. Area arrays provide enhanced input/output contacts for a given footprint or area, i.e., have high input/output density. This is especially true when the entire surface area is used for the area array input/output. However, because of circuit routing capabilities of both flexible circuits and PCB structures, it is often impossible, not feasible, and/or too expensive to construct device interconnect systems that can escape (i.e., route to another device, component, subsystem, etc.) such high density device I/O. Accordingly, device I/O quantity and configurations are again limited by interconnect system capability and density. Furthermore, even if not limited, high density interconnect systems are often incompatible with commonly used terminations for interconnection, for example, high density input/output sockets, clamps, etc.

SUMMARY OF THE INVENTION

The present invention provides, in one aspect, a structure comprising an interposer having a substrate formed of a semiconductor material, with first input/output contacts disposed over a first main surface thereof and second input/output contacts disposed over a second main surface thereof. The second input/output contacts are electrically connected to the first input/output contacts. The first input/output contacts are for attachment to input/output pads of a device to which the interposer is to be attached. The second input/output contacts disposed over the second main surface of the interposer's substrate facilitate coupling of the interposer to contacts of a component to which the interposer is also to be attached.

In another aspect, a structure is provided which includes an integrated circuit device having a substrate with input/output pads disposed over a surface thereof. The structure further includes an interposer which has a substrate formed of a semiconductor material, and has first input/output contacts disposed over a first main surface thereof and second input/output contacts disposed over a second main surface thereof. The second input/output contacts are electrically connected to the first input/output contacts. The first input/output contacts disposed over the first main surface of the substrate are electrically attached to the input/output pads of the integrated circuit device, and the second input/output contacts disposed over the second main surface facilitate coupling to contacts of a component to which the interposer can also be attached.

Methods of fabricating and connecting the above-summarized structures are also described and claimed herein. Further, other embodiments and aspects of the invention are described in detail and claimed herein.

BRIEF DESCRIPTION OF THE DRAWINGS

The present invention may take form in various structures and arrangements of structures, and in various steps and arrangement of steps. The drawings presented herewith are for purposes of illustrating certain embodiments and should not be construed as limiting the invention. The subject matter which is regarded as the invention is particularly pointed out and distinctly claimed in the claims at the conclusion of the specification.

FIG. 4A is a cross-sectional illustration of still another embodiment of a device assembly employing an interposer, in accordance with an aspect of the present invention;

FIG. 4B is a top plan view of the interposer embodiment of FIG. 4A, in accordance with an aspect of the present invention; and FIG. 4C is a bottom plan view of the interposer embodiment of FIG. 4A, in accordance with an aspect of the present invention.

DETAILED DESCRIPTION OF THE INVENTION

Various embodiments of an interposer, interposer package and device assembly employing the same are depicted and described herein by way of example. However, those skilled in the art will recognize that the interposer and interposer package presented can be employed in a wide variety of implementations to connect, for example, an integrated circuit device to another component, such as another integrated circuit device, a flexible interconnect, or a printed circuit board subsystem, etc. The claims presented herein are intended to encompass all such implementations.

One concept of the interposer and interposer package described herein is the fabrication of the interposer substrate of a semiconductor material, for example, matching the substrate material of the device to which the interposer is to be electrically connected. By way of example, if the device is an integrated circuit chip having a silicon substrate, then the interposer is also fabricated with a silicon substrate. Since silicon based integrated circuit devices predominate today, the discussion provided herein primarily discusses a silicon interposer. However, those skilled in the art will recognize that the interposer's substrate material could comprise any semiconductor material, including, silicon, silicon carbide, gallium-arsenide, etc. Advantageously, by fabricating the interposer of semiconductor material, e.g., the same substrate material as the integrated circuit device, then standard wafer processes can be employed to fabricate the interposer, including creating input/output contacts on the interposer at the very fine pitches achievable using wafer processing.

In one embodiment, an interposer can be utilized to provide an interconnect system and package for a device with an active area on the device's top surface and input/output pads located on the device's bottom surface. Such a device might comprise an acoustic (ultrasound) sensor, optical (LCD, photodiode, spatial light modulator) device, or a bare integrated circuit chip, etc. One main surface of the interposer substrate has input/output contacts configured to match the input/output pads of the device, while the other main surface of the interposer substrate supports input/output contacts configured to match, or otherwise interface to or be compatible with, for example, commercial or custom interconnect systems, such as sockets, clamps, pads, etc. Interconnect from one main surface of the interposer substrate to the other main surface can be achieved by various means, including by vias constructed using, for example, laser, high rate reactive ion etching, etc., for via formation and standard wafer processes for via metalization.

Figure 1:
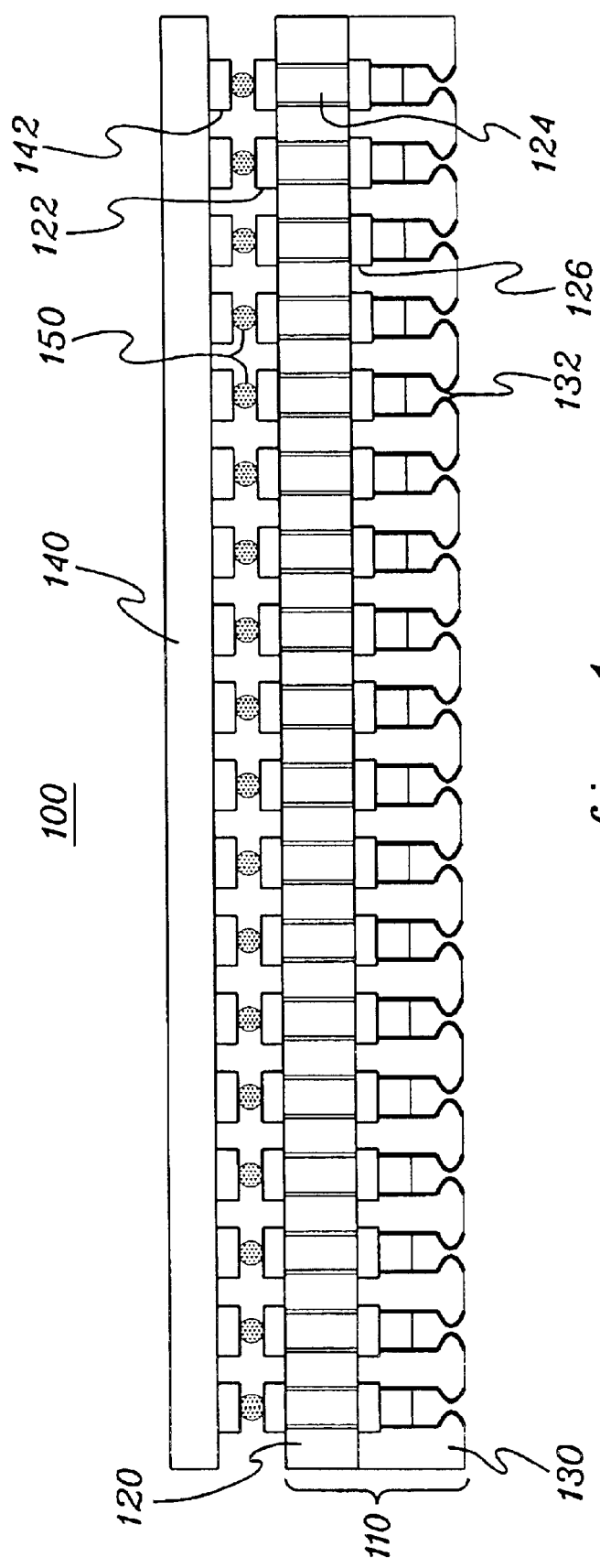
FIG. 1 is cross-sectional illustration of one embodiment of a device assembly employing an interposer package, in accordance with an aspect of the present invention.

FIG. 1 depicts a cross-sectional embodiment of one example of a device assembly employing an interposer package, in accordance with an aspect of the present invention. This device assembly, generally denoted 100, includes an interposer package 1100 having an interposer 120 and encapsulate 130 surrounding at least a portion of the lower main surface of the interposer. An upper main surface of the interposer's substrate contains first input/output contacts 122 which are shown soldered 150 to input/output pads 142 disposed on a surface of a device 140, such as an unpackaged (i.e., bare) integrated circuit chip. As shown, first input/output contacts 122 electrically connect via metalized vias 124 to second input/output contacts 126 disposed on the lower main surface of the interposer 120 substrate. Vias 124 are electrically isolated from the interposer substrate. Second input/output contacts 126 electrically connect to spring-biased pluggable contacts 132, which are partially supported by and electrically isolated by encapsulate 130.

One method of fabricating interposer package 110 is to select the interposer substrate semiconductor material to match the substrate material employed by device 140; for example, silicon. This minimizes mechanical stress, strain and otherwise provides a high reliability package and interconnect, and also provides for an electrical interconnect performance equivalent to the device. Once the substrate material is selected, vias are created (by, for example, drilling, high rate reactive ion etching, etc., the substrate), insulated to electrically isolate the substrate and subsequent electrical interconnections, and then metalized to form electrical connections from the upper main surface of the interposer substrate to the lower main surface of the interposer substrate. In the embodiment of FIG. 1, the vias formed within the interposer substrate are aligned under or in close proximity to the first input/output contacts to be disposed on the upper main surface of the interposer substrate and the second input/output contacts to be disposed on the lower main surface of the interposer substrate. The first input/output contacts, in one embodiment, are patterned to match the input/output pad configuration of the device 140 to which the interposer is to be attached, while the second input/output contacts are configured to facilitate connection to a component to which the interposer package is also to be connected, for example, once the device assembly is formed. In one embodiment, the via diameters are dependent on the quantity and location of the device input/output pads, and first input/output contacts on the interposer substrate. For high density input/output configurations, via diameters may be as small as ten microns or less using today's technology.

Following via creation, standard wafer processes (photolithography, wet chemistry, etc.) are employed to create metalized through vias. One embodiment of the through-via construction process is to use wet chemistry (to relieve stress) followed by oxidation to establish an insulative layer covering the surface of the substrate and the walls of the vias (without filling the vias) to provide the necessary electrical isolation from the substrate. Seed metal is then deposited to establish a metal layer in the vias, prior to plating the vias with metal, for example, copper, nickel, gold, etc. A photomask is applied and the circuitry (e.g., input/output) contacts and interconnect to the through vias, if any, is patterned. Once complete, an interposer structure such as depicted in FIG. 1 is attained, wherein the metalized through vias extend from an upper main surface to a lower main surface of the interposer substrate.

Following through-via creation, standard wafer processes are used to fabricate the interposer's first input/output contacts, patterned and located to match the input/output pads of the device to which the interposer is to be attached. On the opposite main surface of the interposer substrate, for example, the terminus or system interconnect side of the interposer, the second input/output contacts are formed. The first and second input/output contacts could be constructed as a stack of metal layers, e.g., copper, nickel and/or gold layers. The actual composition of the metal layers in the input/output contact stacks would be dependent on the substrate material and attachment method used, for example solder, anisotropic electrically conductive adhesive, or film, epoxy, etc.

Following construction of the input/output contacts, system interconnect features are formed. In one embodiment, conductive fingers, e.g., springs, may be formed or attached using standard wafer processes, or electrically connected to the interposer's second input/output contacts on the terminus or system interconnect side of the through-vias. The finger design can be determined by the second input/output contact geometry and pitch as well as the interconnect system (not shown) used to make contact with the interposer. In one embodiment, the fingers are designed to accept a flexible interconnect circuit with edge located input/output pads (not shown), much like a printed circuit board (PCB) edge connector system. The fingers would be compatible with many insertions and removals of the flexible interconnect circuit as well as provide sufficient clamping force to hold the flexible circuit in contact with the substrate springs when in use. In this embodiment, the fingers could be encapsulated, for example, using filled epoxy, such as Plaskon (available from Cookson Electronics, of Foxboro, Mass., a division of Cookson Group, plc), to form a mechanical structure or interposer package.

An interposer and interposer package constructed as discussed above solves the problems associated with the existing disparity between device input/output pad densities and achievable interconnect system densities by utilizing, for example, a silicon substrate with through-vias to transpose high density device input/output configurations to a system configuration capable of using available commercial or custom interconnect methods, technologies, processes. Further, the interposer disclosed herein can be fabricated to include multiple, commercially available (or custom) connector systems, methods, etc. These connectors, which would electrically connect to the second input/output contacts on the lower surface of the interposer substrate, today feature input/output pitches at one mm pitch, or less. In the case of advanced capability, there are commercially available connectors with input/output pitches under 0.5 mm. Furthermore, multiple connectors can be fabricated and attached to the interposer to affect input/output pitches as small as 0.3 mm, the equivalent to commercially advanced packaging capabilities using flip-chip technology. Beyond the use of an interposer for affecting a high performance (i.e., short electrical signal path, matched coefficient of thermal expansion substrate, etc.) interconnect system for high density input/output devices, the interposer can be employed in a bare chip packaging approach as follows.

In cross-section, an integrated circuit chip can be decomposed into two regions, an active region and a bulk substrate region. The active region often comprises only a small portion of an integrated circuit chip's total thickness (for example, less than one-third), with the remaining two-thirds being the chip's substrate. An interposer having a substrate matching the substrate of the integrated circuit chip, is analogous to the bulk region of a decomposed integrated circuit chip. By processing (figuratively) only the bulk region to create a package, an interposer as described herein can subsequently be combined with the active region of an integrated circuit chip only, thus forming a packaged chip assembly. An advantage of this approach is that the active portion of the chip would not be subject to the harsh, subsequent packaging processes and mechanical stresses involved in creating interposer interconnect as described herein. Furthermore, because the interposer does not require any active elements, it can be treated, processed, handled, as a substrate. This substrate could, however, be configured or processed to include electrical interconnect, active or passive circuitry, heat pipes, heat sinks, or otherwise be utilized to include additional electrical, mechanical or thermal features. The type and complexity of these features is application, performance, and cost specific.

For example, to create a chip sized, bare chip assembly, an application specific integrated circuit, for example, a microprocessor could be thinned and processed to feature backside input/output pads. A silicon interposer substrate utilizing through-vias with input/outputs contacts on one side matching the processor input/output pads is fabricated. On the other side of the substrate, a socket could be formed to mate with system interconnect. In an alternate embodiment, the opposite side of the interposer substrate could be processed to feature interconnect with input/output contacts in an area array configuration to accept chip size packaged (CSP, flip chip, etc.) memory subsystems. The interconnect would connect the memory subsystem, for example, to the application specific integrated circuit utilizing the shortest interconnect link possible to provide the highest electrical performance. Furthermore, because the interposer's substrate material is the same as the integrated circuit device's substrate, the package is coefficient of thermal expansion (CTE) matched to the application specific integrated circuit, thus providing superior mechanical performance and reliability.

Further examples of interposers and device assemblies employing the same are depicted in FIGS. 2–4C.

Figure 2:
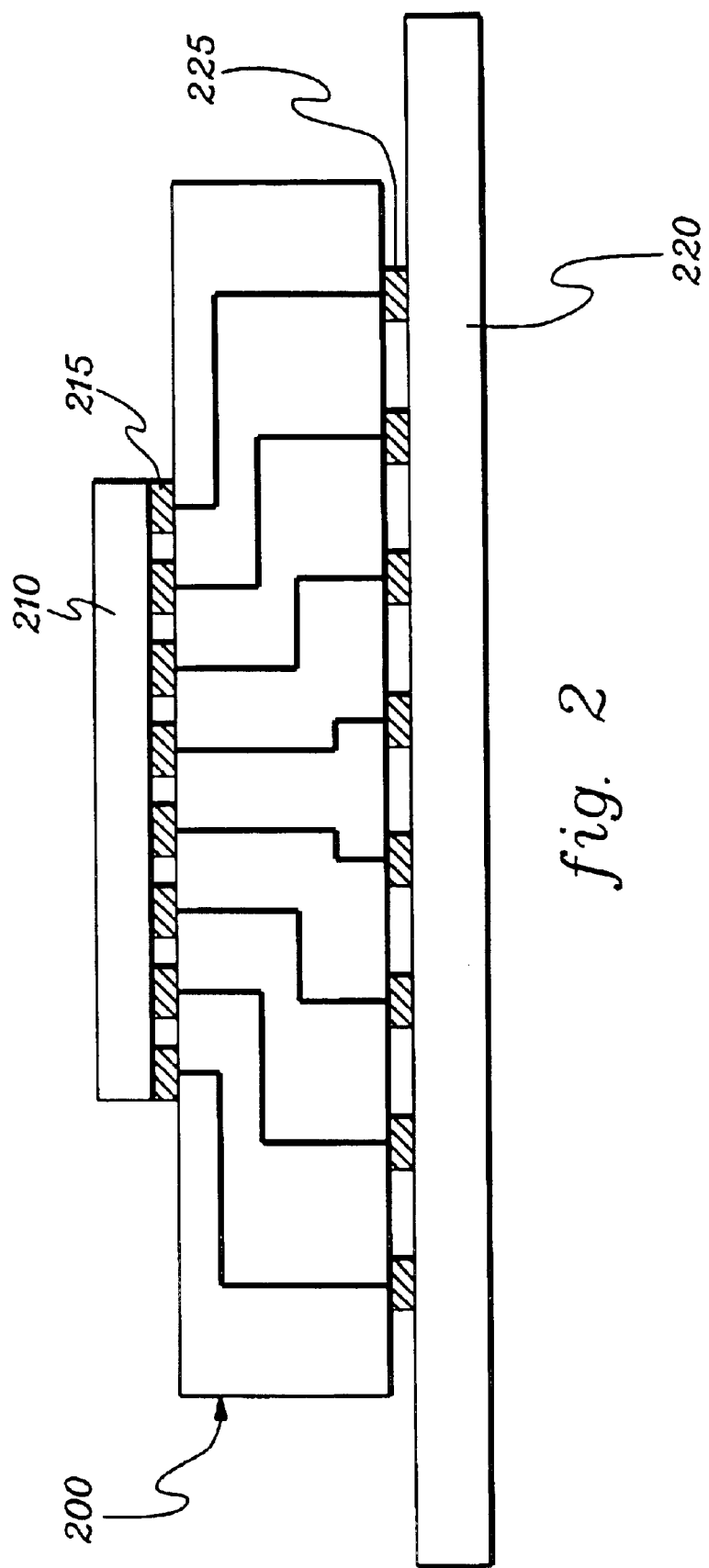
FIG. 2 is a cross-sectional illustration of an alternate embodiment of a device assembly, including an integrated circuit device and interposer coupled thereto, shown connected to a printed circuit board subsystem, in accordance with an aspect of the present invention.

In FIG. 2, an interposer 200 is shown electrically connected to a device 210, disposed over an upper main surface thereof, and to a subsystem, such as a printed circuit board 220, on a lower main surface. In this embodiment, the input/output contacts on the upper main surface of interposer 200 align with the input/output pads of device 210 to create electrical interconnection stacks 215 connecting device 210 to interposer 200. The input/output contacts on the lower surface of interposer 200 align with corresponding contacts on subsystem 220 to create electrical interconnection stacks 225. As shown, the density of interconnect on the upper surface of interposer 200 is greater than the density of interconnect on the lower surface of interposer 200. In this embodiment, interposer 200 operates to fan out the input/output pads of device 210 to match the interconnect density on subsystem 220. A layered metalization approach could be employed or combined with through-via structures to create the desired fan-out pattern for a particular interposer implementation. As described above, interposer 200 is formed from the same substrate material as device 210, for example, silicon. Subsystem 220 could comprise a printed circuit board or ceramic substrate, etc.

Figure 3A:
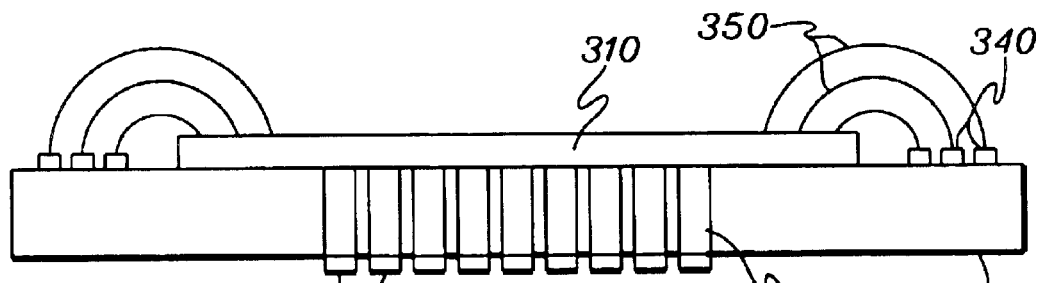
FIG. 3A is a cross-sectional illustration of still another embodiment of a device assembly employing an interposer, in accordance with an aspect of the present invention.
Figure 3B:
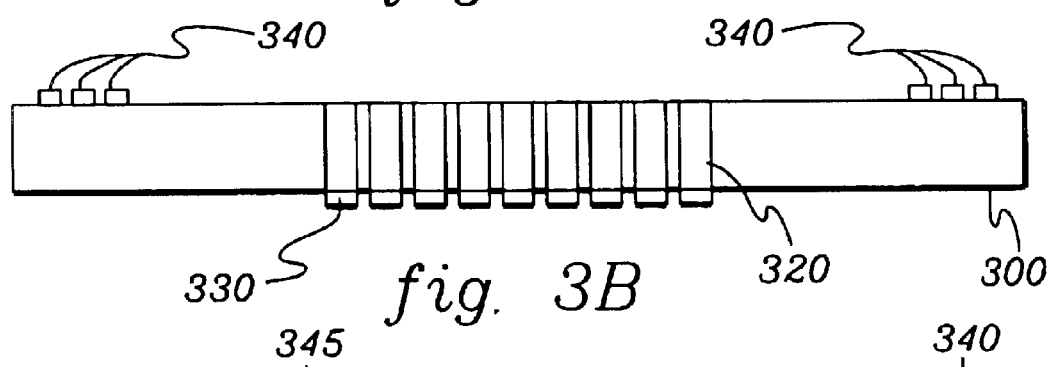
FIG. 3B is a cross-sectional illustration of the interposer embodiment of FIG. 3A, in accordance with an aspect of the present invention.
Figure 3C:
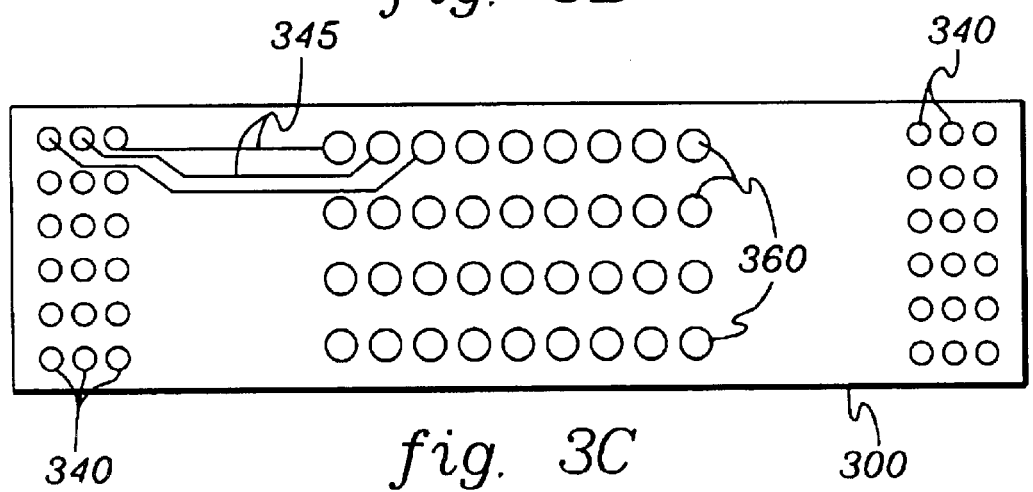
FIG. 3C is a top plan view of the interposer embodiment of FIGS. 3A & 3B, in accordance with an aspect of the present invention.
Figure 3D:
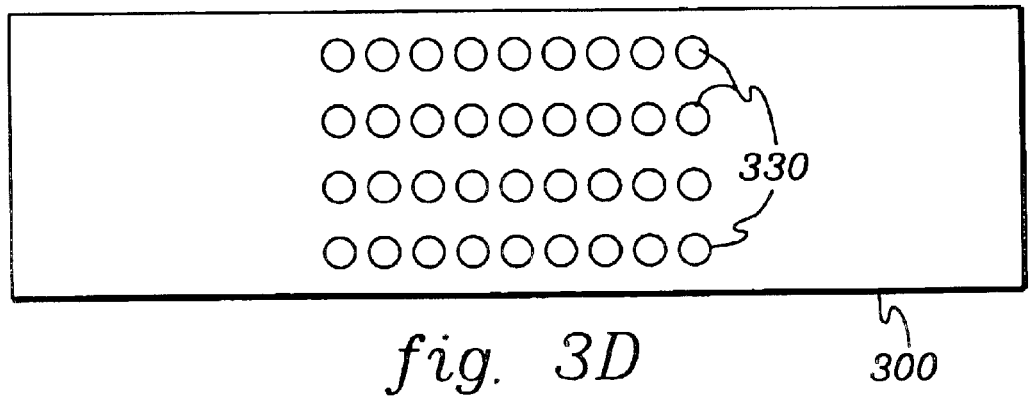
FIG. 3D is a bottom plan view of the interposer embodiment of FIGS. 3A, 3B & 3C, in accordance with an aspect of the present invention.

FIGS. 3A–3D depict an alternate embodiment of a device assembly comprising an interposer 300 and an integrated circuit device 310. As shown in FIG. 3B, interposer 300 includes metalized vias 320 connecting electrical pads 360 (FIG. 3C) on an upper main surface of the interposer substrate to input/output contacts 330 disposed over a lower main surface of the interposer substrate. In this example, electrical pads 360 and input/output contacts 330 have equivalent or similar feature size and densities.

Electrical interconnect 345 is provided over the upper surface of the interposer substrate to connect electrical pads 360 to input/output contacts 340 disposed along the periphery of interposer 300. Electrical wiring 350 is employed to electrically interconnect the input/output contacts 340 of interposer 300 to input/output pads (not shown) disposed on an upper surface of integrated circuit device 310, as shown in FIG. 3A.

FIG. 4A depicts another embodiment of a device assembly employing an interposer 400 and an integrated circuit device 410. In this example, first input/output contacts on an upper surface of interposer 400 are aligned to input/output pads on an opposing surface of device 410 such that interconnection stacks 405 are formed electrically connecting device 410 to interposer 400. Interposer 400 has electrical interconnect for fanning in the first input/output contacts on its upper surface to an array of second input/output contacts 415 on its lower surface. As shown, the density of the interconnect stacks 405 coupling device 410 to interposer 400 is less than the density of the second input/output contacts 415 disposed on the lower surface of interposer 400. For example, the interconnect stacks 405 might comprise 1 mm pitch, while the second input/output contacts might be an array of 0.5 mm pitch contacts. In one embodiment, the second input/output contacts could be electrically connected to connectors 420, a first of which might comprise a power plane connection, and a second, a ground plane connection. In this example, the density of the interconnect stacks is increased from the upper surface of the interposer to the lower surface of the interposer in order to provide room for a heat sink 430 and circuitry 440, such as active and/or passive circuits or components. These active and/or passive circuits or components could electrically connect to any one of the first input/output contacts on the upper surface of the interposer, or the second input/output contacts disposed on the lower surface of the interposer, as desired for a particular implementation.

Those skilled in the art will understand from the above examples, that provided herein is a novel interconnect structure and interconnect package which can be employed to directly connect a device, such as an unpackaged integrated circuit chip, to another component, such as a second integrated circuit chip, a printed circuit board or other subsystem component. By fabricating the interposer substrate of a semiconductor material, and more particularly, by matching the substrate material of the interposer to that of the device, low cost, high performance, high yield packaging can be obtained using standard chemistry, mechanical processes, etc. Further, the techniques disclosed herein can be used as a platform for integration of thermal management, passive or active circuit elements, components, etc. with the integrated circuit device or subsystem to which the device is to be attached. Mechanical and thermal management systems for rather thin, fragile integrated circuit chips and devices are also provided.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A structure comprising:
an interposer comprising a substrate formed of a semiconductor material and having first input/output contacts disposed over a first main surface thereof and second input/output contacts disposed over a second main surface thereof, wherein the second input/output contacts are electrically connected to the first input/output contacts; and
wherein the first input/output contacts disposed over the first main surface of the substrate are for attachment to input/output pads of a device to which the interposer is to be attached, and wherein the second input/output contacts disposed over the second main surface facilitate coupling to contacts of a component to which the interposer is also to be attached; and
wherein the first input/output contacts disposed over the first main surface have a different pitch than the second input/output contacts disposed over the second main surface of the interposer's substrate.

2. The structure of claim 1, wherein the first input/output contacts disposed over the first main surface of the interposer substrate have a comparable feature size to the input/output pads of the device to which the interposer is to be attached.

3. The structure of claim 1, wherein the device comprises a bare integrated circuit chip having an x,y surface area, and wherein the interposer has a surface area similarly sized to the x,y surface area of the bare integrated circuit chip.

4. The structure of claim 3, wherein the bare integrated circuit chip comprises a first integrated circuit chip, the component comprises a second integrated circuit chip, and the interposer facilitates electrical connection between the first integrated circuit chip and the second integrated circuit chip.

5. The structure of claim 1, wherein the semiconductor material comprises at least one of silicon, silicon carbide, and gallium-arsenide.

6. The structure of claim 1, wherein the device has a substrate formed of a semiconductor material and the interposer's substrate semiconductor material matches at least in part the semiconductor material of the device's substrate.

7. The structure of claim 1, wherein each input/output contact of the first input/output contacts disposed over the first main surface of the interposer's substrate is electrically connected to at least one input/output contact of the second input/output contacts disposed over the second main surface of the interposer's substrate, and wherein the second input/output contacts disposed over the second main surface of the interposer's substrate have a larger pitch than the first input/output contacts disposed over the first main surface of the interposer's substrate.

8. The structure of claim 1, wherein each input/output contact of the first input/output contacts disposed over the first main surface of the interposer's substrate is electrically connected to at least one input/output contact of the second input/output contacts disposed over the second main surface of the interposer's substrate, and wherein the second input/output contacts disposed over the second main surface of the interposer's substrate have a smaller pitch than the first input/output contacts disposed over the first main surface of the interposer's substrate.

9. The structure of claim 1, wherein the interposer further comprises at least one of a heat sink for facilitating dissipation of heat from the device when the interposer is attached thereto, and an active or a passive circuit or component disposed on the interposer's substrate and electrically coupled to one or more of the first input/output contacts disposed over the first main surface of the substrate or the second input/output contacts disposed over the second main surface of the substrate.

10. A structure comprising:
an interposer comprising a substrate formed of a semiconductor material and having first input/output contacts disposed over a first main surface thereof and second input/output contacts disposed over a second main surface thereof, wherein the second input/output contacts are electrically connected to the first input/output contacts:
wherein the first input/output contacts disposed over the first main surface of the substrate are for attachment to input/output pads of a device to which the interposer is to be attached, and wherein the second input/output contacts disposed over the second main surface facilitate coupling to contacts of a component to which the interposer is also to be attached; and
wherein the interposer further comprises an interposer package, the interposer package having an encapsulate surrounding at least a portion of the second input/output contacts disposed over the second main surface of the interposer's substrate.

11. The structure of claim 9, wherein the interposer package further comprises pluggable input/output contacts disposed over the second main surface of the substrate and electrically connected to the second input/output contacts over the second main surface of the interposer's substrate, the pluggable input/output contacts facilitating plugging/ unplugging of the interposer to/from the component.

12. A structure comprising:
an integrated circuit device having input/output pads disposed over a surface thereof;
an interposer having a substrate formed of a semiconductor material, and having first input/output contacts disposed over a first main surface thereof and second input/output contacts disposed over a second main surface thereof, wherein the second input/output contacts are electrically connected to the first input/output contacts;
wherein the first input/output contacts disposed over the first main surface of the substrate are electrically attached to the input/output pads of the integrated circuit device, and wherein the second input/output contacts disposed over the second main surface facilitate coupling to contacts of a component to which the interposer can also be attached; and
wherein the first input/output contacts disposed over the first main surface have a different pitch than the second input/output contacts disposed over the second main surface of the interposer's subtrate.

13. The structure of claim 12, wherein the integrated circuit device comprises a first integrated circuit chip and wherein the component comprises at least one of a second integrated circuit chip, a flexible circuit interconnect, and a printed circuit board.

14. The structure of claim 12, wherein the semiconductor material comprises at least one of silicon, silicon carbide, and gallium-arsenide.

15. The structure of claim 12, wherein the integrated circuit device has a substrate formed of a semiconductor material and the interposer's substrate semiconductor material matches at least in part the semiconductor material of the integrated circuit device's substrate.

16. The structure of claim 12, wherein the interposer further comprises at least one of a heat sink for facilitating dissipation of heat from the integrated circuit device, and an active or a passive circuit or component disposed on the interposer's substrate and electrically coupled to one or more of the first input/output contacts disposed over the first main surface of the interposer's substrate or the second input/output contacts disposed over the second main surface of the interposer's substrate.

17. The structure of claim 12, wherein the interposer further comprises an interposer package, the interposer package including an encapsulate surrounding at least a portion of the second input/output contacts disposed over the second main surface of the interposer's substrate.

18. The structure of claim 17, wherein the interposer package further comprises pluggable input/output contacts disposed over the second main surface of the interposer substrate and electrically connected to the second input/ output contacts over the substrate's second main surface.

19. A structure comprising:
an integrated circuit device having input/output pads disposed over a surface thereof;
an interposer having a substrate formed of a semiconductor material and having first input/output contacts disposed over a first main surface thereof and second input/output contacts disposed over a second main surface thereof, wherein the second input/output contacts are electrically connected to the first input/output contacts;

wherein the first input/output contacts disposed over the first main surface of the substrate are electrically attached to the input/output pads of the integrated circuit device, and wherein the second input/output contacts disposed over the second main surface facilitate coupling to contacts of a component to which the interposer can also be attached; and
further comprising electrical interconnection electrically connecting the first input/output contacts to the second input/output contacts of the interposer's substrate, wherein the electrical interconnection is electrically isolated from the semiconductor material of the interposer's substrate.

20. The structure of claim 12, wherein the integrated circuit device comprises a bare integrated circuit chip.

21. The structure of claim 20, wherein the interposer further comprises pluggable input/output contacts disposed over the second main surface of the interposer substrate and electrically connected to the second input/output contacts over the substrate's second main surface, the pluggable input/output contacts facilitating plugging/unplugging of the interposer to/from the component.

22. A method for contacting input/output pads of a device, comprising:
providing an interposer having a substrate formed of a semiconductor material, wherein the interposer includes first input/output contacts disposed over a first main surface of the interposer's substrate and second input/output contacts disposed over a second main surface of the interposer's substrate, the first input/output contacts being electrically connected to the second input/output contacts;
electrically connecting the interposer to a device by electrically connecting the first input/output contacts of the interposer to input/output pads of the device; and
wherein the first input/output contacts disposed over the first main surface of the interposer have a different pitch than the second input/output contacts disposed over the second main surface of the interposer substrate.

23. The method of claim 22, wherein the semiconductor material comprises at least one of silicon, silicon carbide, and gallium-arsenide.

24. The method of claim 22, wherein the device has a substrate formed of a semiconductor material and the interposer's substrate semiconductor material matches at least in part the semiconductor material of the device's substrate.

25. The method of claim 22, wherein the second input/ output contacts disposed over the interposer's second main surface facilitate coupling of the interposer to contacts of a component to which the interposer can also be attached, wherein the component comprises at least one of another device, a flexible circuit interconnect, or a printed circuit board subsystem.

26. The method of claim 22, wherein the device comprises a bare integrated circuit chip.

27. The method of claim 26, wherein the bare integrated circuit chip has an x,y surface area, and wherein the interposer has an x,y surface area similar to the x,y surface area of the bare integrated circuit chip.

* * * * *